US012046318B2

(12) United States Patent
Aita et al.

(10) Patent No.: US 12,046,318 B2
(45) Date of Patent: Jul. 23, 2024

(54) SEMICONDUCTOR DEVICE INCLUDING A MEMORY MANAGEMENT UNIT

(71) Applicant: RENESAS ELECTRONICS CORPORATION, Tokyo (JP)

(72) Inventors: Yasuo Aita, Tokyo (JP); Daisuke Kawakami, Tokyo (JP); Toshiyuki Hiraki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/951,294

(22) Filed: Sep. 23, 2022

(65) Prior Publication Data
US 2023/0146281 A1 May 11, 2023

(30) Foreign Application Priority Data
Nov. 10, 2021 (JP) .................................. 2021-182950

(51) Int. Cl.
*G11C 29/54* (2006.01)
*G06F 12/00* (2006.01)
*G06F 12/10* (2016.01)
*G06F 12/109* (2016.01)

(52) U.S. Cl.
CPC ............ *G11C 29/54* (2013.01); *G06F 12/109* (2013.01); *G06F 2212/657* (2013.01)

(58) Field of Classification Search
CPC .............. G06F 12/109; G06F 12/1036; G06F 2212/1032; G06F 2212/681; G06F 2212/684; G06F 12/1009; G06F 2212/657; G11C 29/54; G11C 29/18; G11C 2029/1208
See application file for complete search history.

(56) References Cited

U.S. PATENT DOCUMENTS

| | | | |
|---|---|---|---|
| 9,921,897 B2* | 3/2018 | Dusanapudi | G06F 11/2231 |
| 10,552,937 B2* | 2/2020 | Cooray | G06T 1/60 |
| 11,138,126 B2* | 10/2021 | Nagarajan | G06F 12/1027 |
| 11,263,150 B2* | 3/2022 | Mendelson | G06F 12/1045 |
| 11,663,131 B2* | 5/2023 | Jo | G06F 12/10 |
| | | | 711/118 |
| 11,775,380 B2* | 10/2023 | Murphy | G06F 11/1004 |
| | | | 714/807 |
| 11,775,443 B2* | 10/2023 | Sherlock | G06F 12/145 |
| | | | 711/163 |
| 2017/0192869 A1* | 7/2017 | Dusanapudi | G06F 13/24 |

FOREIGN PATENT DOCUMENTS

JP 2000-148589 A 5/2000

* cited by examiner

*Primary Examiner* — Justin R Knapp
(74) *Attorney, Agent, or Firm* — Rimon P.C.

(57) ABSTRACT

A semiconductor device includes a processing unit that issue a memory access request with a virtual address, a first and a second memory management unit and a test result storage unit. The first and the second memory management unit are hierarchically provided, and each include address translation unit translating the virtual memory of the memory access request into a physical address and self-test unit testing for the address translation unit. The test result storage unit stores a first self-test result that indicates a result of the first self-test unit and a second self-test result that indicates a result of the second self-test unit.

16 Claims, 14 Drawing Sheets

SEMICONDUCTOR DEVICE INCLUDING A MEMORY MANAGEMENT UNIT

CROSS-REFERENCE TO RELATED APPLICATIONS

The disclosure of Japanese Patent Application No. 2021-182950 filed on Nov. 10, 2021, including the specification, drawings and abstract is incorporated herein by reference in its entirety.

BACKGROUND

The present invention relates to a semiconductor device, and more particularly, to a semiconductor device including a memory management unit for translating virtual addresses into physical addresses.

Recently, semiconductor devices for in-vehicle have not only central processing unit (CPU) but also a plurality of dedicated processing units that each execute specific processes at high speed in order to achieve higher performance and multifunctionalization. For example, the dedicated processing unit is an image processing unit that executes compressive/decompression processing of image data, a DMA (Direct Memory Access) controller for DMA transmission, or the like. Such a dedicated processing unit performs memory access control using virtual addresses in order to efficiently use the external memory as a shared resource.

The virtual addresses are addresses on the virtual memory to which the dedicated processing unit accesses data, and are different from addresses effective on the physical memory (physical addresses). When there are a plurality of dedicated processing units and the dedicated processing units use virtual memory spaces different from each other, a memory management unit (MMU) may be provided for each dedicated processing unit.

The MMU includes a translation lookaside buffer (TLB) for faster address translation. The TLB serves as a cache of page tables which are translation information for mapping virtual addresses to physical addresses.

The TLB can be provided in a hierarchical structure like cache. Therefore, MMUs having TLBs with different capacities are hierarchically provided. When a dedicated processing unit accesses the memory using the virtual address, first, address translation is performed in an MMU (primary MMU) closest to the dedicated processing unit. If the entry corresponding to the virtual address is not found in the TLB of the primary MMU, the entries in the TLB of the secondary MMU are retrieved. If there is no entries corresponding to the virtual address in the TLB of the secondary MMU, the entry corresponding to the virtual address is retrieved from the page table of the external memory. In this way, the page table walk is performed in the order of the primary MMU, the secondary MMU, and the memory to translate the virtual address into a physical address.

There are techniques disclosed about a MMU as follows.

Japanese Unexamined Patent Application Publication No. 2000-148589 (Patent Document 1) discloses a memory management apparatus having divided TLBs. In Patent Document 1, if an input virtual address does not hit in a selected one of the divided TLBs, the memory management apparatus translates the input virtual address by using the other of the divided TLBs.

SUMMARY

Semiconductor devices for in-vehicle are to include functional safety mechanisms. Therefore, a failure detection of the address translation function of a MMU have been awaited.

A virtual address set in the memory access request from a dedicated processing unit is translated into a physical address by performing a page table walk in the order of the primary MMU, the secondary MMU, and the memory. Then, data is read from the physical memory based on the translated physical address. Thus, by comparing the data read from the physical memory with the expected value data, a failure of the address translation function can be detected. However, in this detection method, it is difficult to specify in which the hierarchical MMUs the failure has occurred. If a failure of the address translation function is detected by this detection method, resetting of the address translation function of all of the primary MMU, the secondary MMU and memory is required. Such a reset operation may take a long time.

Other objects and novel features will become apparent from the description of this specification and the accompanying drawings.

According to one embodiment, the semiconductor device includes a processing unit configured to issue a memory access request with a virtual address, a first memory management unit coupled to the processing unit, and a second memory management unit coupled to the first memory management unit. The first memory management unit includes a first address translation unit translating the virtual address of the memory access request into a physical address, and a first self-test unit testing for the first address translation unit. The second memory management unit includes a second address translation unit translating the virtual address of the memory access request into a physical address if the virtual address of the memory access request is not translated by the first address translation unit, and a second self-test unit testing for the second address translation unit. The semiconductor device further includes a result storage unit storing a first self-test result that indicates a result of the first self-test unit and a second self-test result that indicates a result of the second self-test unit.

According to the above-mentioned embodiment, it is possible to identify which of the MMUs have a failure of address translation function. As a result, it is possible to execute appropriate process in accordance with the identified failure point.

DETAILED DESCRIPTION

Figure 1:
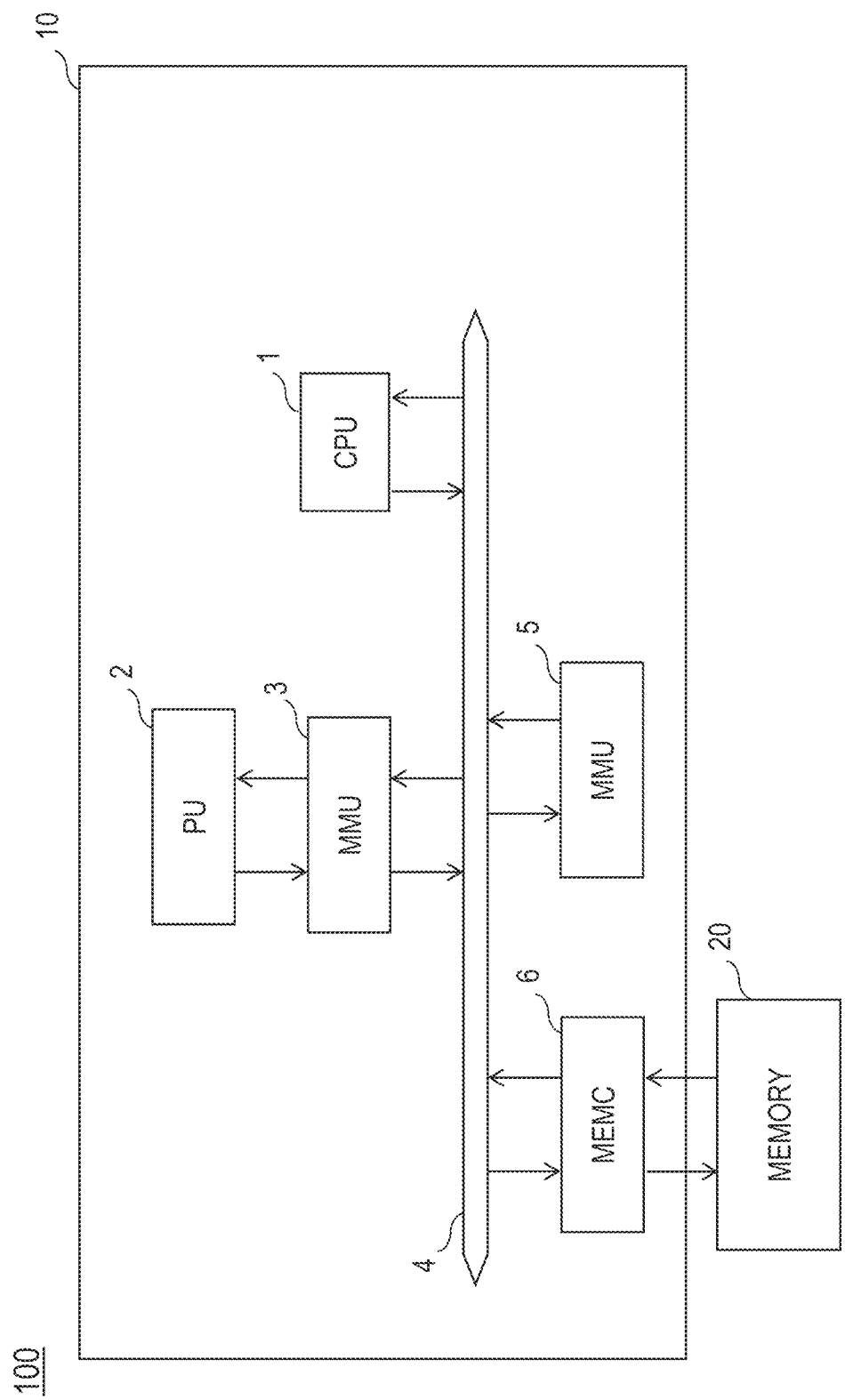
FIG. 1 is a block diagram showing a configuration of a data processing apparatus according to a first embodiment.

Hereinafter, a data processing device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a block diagram showing a configuration of a data processing apparatus according to a first embodiment. As shown in FIG. 1, the data processing apparatus 100 includes a semiconductor device 10 and a memory 20. The semiconductor device 10 includes a central processing unit (CPU) 1, a dedicated processing unit 2, memory management units (MMUs) 3 and 5, a bus 4, and a memory controller 6. The memory 20 is a physical memory, such as a dynamic random access memory (DRAM), but not be limited to DRAM.

The CPU 1 executes a software program such as an OS program or an application program stored in a storage device such as a ROM (Read Only Memory) (not shown).

The dedicated processing unit 2 is an accelerator that executes a part of the processing of the application program. For example, the dedicated processing unit 2 may be an image processing unit that executes compressive/decompression processing of image data, or a DMA controller for a DMA transfer.

The MMUs 3 and 5 are hierarchically provided memory management units. The MMUs 3 and 5 each translate a virtual address set in a memory access request from the dedicated processing unit 2 into a physical address. In the first embodiment, the MMU 3 is a primary MMU (upper level MMU) and the MMU 5 is a secondary MMU (lower level MMU). That is, the MMU 3 coupled to the dedicated processing unit 2 is the primary MMU (upper level MMU), and the MMU 5 coupled via the bus 4 is the secondary MMU (lower level MMU). As will be described in detail below, the MMUs 3 and 5 each have a translation lookaside buffer (TLB) for caching a page table. The number of TLB entries in the MMU 3 is less than the number of TLB entries in the MMU 5. Therefore, the search operation of the TLB of the MMU 5 is slower than the search operation of the TLB of the MMU 3 having fewer entries. In addition, as will be described in detail below, each of the MMUs 3 and 5 has a self-test unit.

The memory controller 6 is coupled between the bus 4 and the memory 20. The memory controller 6 accesses the memory 20 in response to an access request received via the bus, and transfers data.

The memory 20 stores data for processing and processing result data of the CPU 1 and the dedicated processing unit 2, and a page table having translation information used for associating virtual addresses with physical addresses. The memory 20 reads and writes data through the memory controller 6.

The semiconductor device 10 is preferably configured on one semiconductor chip, but is not limited thereto. The CPU 1, the dedicated processing unit 2, the MMU 3, and the memory controller 6 can also be formed as separate semiconductor devices.

Figure 2:
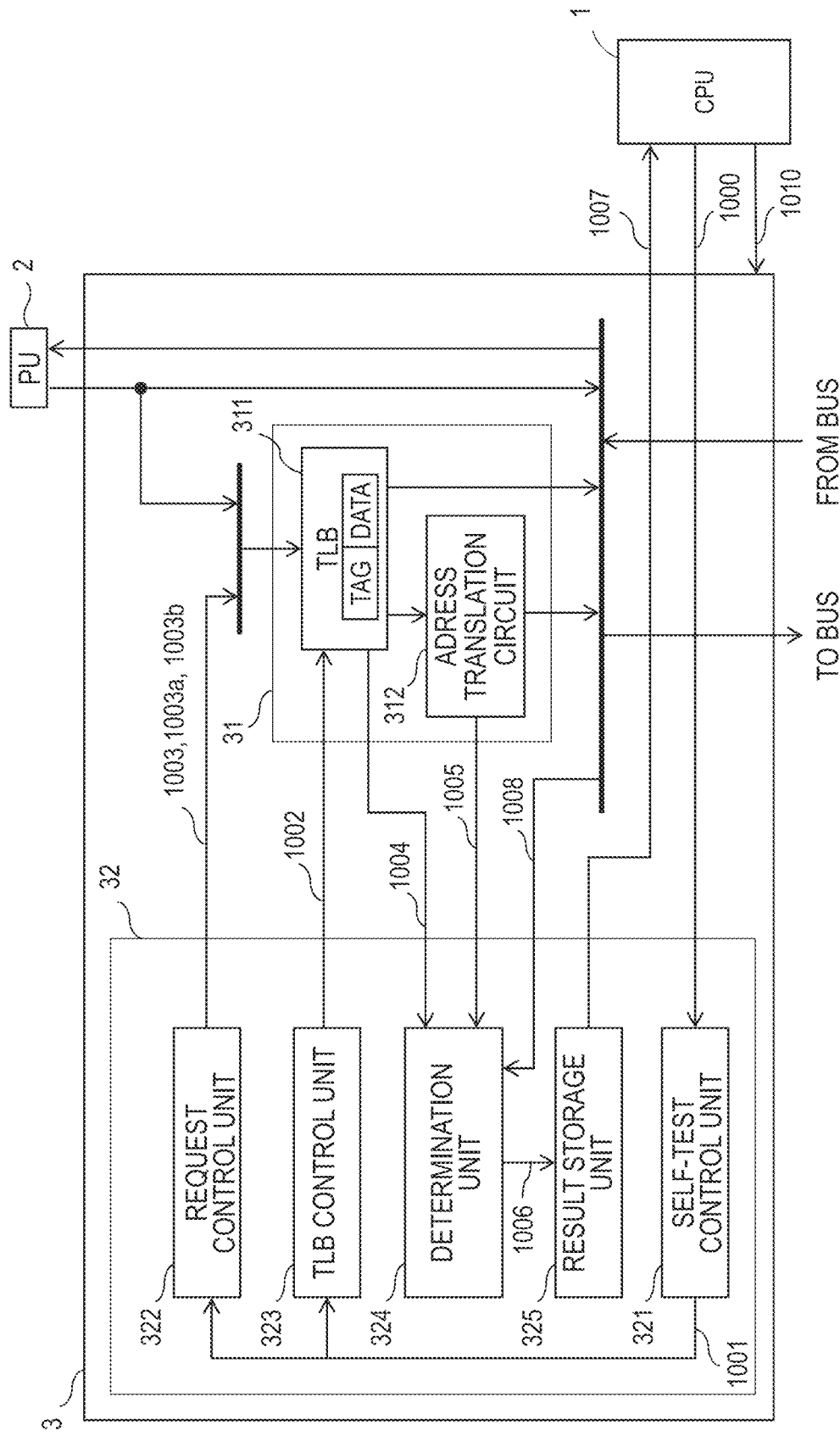
FIG. 2 is a block diagram showing an example of the configuration of the MMU.

Next, the configuration of the MMU 3 according to the first embodiment will be described. FIG. 2 is a block diagram showing an exemplary configuration of the MMU 3. As shown in FIG. 2, the MMU 3 includes an address translation unit 31 and a self-test unit 32.

The address translation unit 31 includes a translation lookaside buffer (TLB) 311 and an address translation circuit 312. The TLB 311 has a plurality of page table entries and functions as a cache of page tables stored in the memory 20. Each of the page table entries has tag information and data. The TLB 311 compares the tag information with the virtual address set in the received memory access request to output a search result. The address translation circuit 312 translates the virtual address into a physical address based on the search result from the TLB 311.

The self-test unit 32 includes a self-test control unit 321, a request control unit 322, a TLB control unit 323, a determination unit 324, and a self-test result storage unit 325.

The self-test control unit 321 receives the self-test start signal 1000 from the CPU 1, which serves as the self-test instruction unit. The self-test control unit 321 starts the self-test control of an address translation function of the MMU 3. Specifically, the self-test control unit 321 outputs the self-test instruction signal 1001 to the request control unit 322 and the TLB control unit 323 in response to the self-test start signal 1000.

The request control unit 322 receives the self-test instruction signal 1001 and generates a memory access request 1003 for the self-test. The memory access request 1003 for the self-test is output to the address translation unit 31.

The TLB control unit 323, in response to the self-test instruction signal 1001, generates a TLB rewrite signal 1002. The TLB rewrite signal 1002 includes page table entry data for the self-test and a TLB rewrite control signal. The TLB control unit 323 outputs the TLB rewrite signal 1002 to the TLB 311. The TLB 311 rewrites the page table entries into page table entries for the self-test in accordance with the TLB rewrite signal 1002.

The determination unit 324 receives a TLB hit/miss signal 1004 and an address translation result 1005 from the address translation circuit 312. The TLB hit/miss signal 1004 indicates a hit/miss result of the TLB 311. The determination unit 324 compares the TLB hit/miss signal 1004 with the expected value of the TLB hit/miss signal. The determination unit 324 further compares the address translation result 1005 with the expected value of the address translation result. Then, the determination unit 324 determines the self-test result of the address translation function based on the comparison result, and outputs a self-test determination result signal 1006. The determination unit 324 receives response information 1008 from the MMU 5 as a response to a memory access request for self-test. The response information 1008 includes the TLB hit/miss information and the address translation result information of the MMU 5. The determination unit 324 determines whether or not the TLB hit/miss information and the address translation result information included in the response information 1008 are as expected. The determination unit 324 determines the self-test result of the address translation function of the MMU 5.

The self-test result storage unit 325 stores the self-test determination result signal 1006 determined by the determination unit 324. The self-test result storage unit 325 includes, for example, a register, but may be any device capable of storing data. The self-test result storage unit 325 stores the self-test result for each page table entry. For example, the self-test result storage unit 325 is a register having a plurality of bits that each may store a self-test result of each page table entry of the MMU 3, a self-test result of each page table entry of the MMU 5, and a self-test result of each page table entry of the memory 20. The self-test result storage unit 325 may include a plurality of registers. The registers store the self-test results of each page table entry of the MMU 3, the self-test results of each page table entry of the MMU 5, and the self-test results of each page table entry of the memory 20, respectively. Such self-test results are read out to the CPU 1 as self-test result data 1007.

Figure 3:
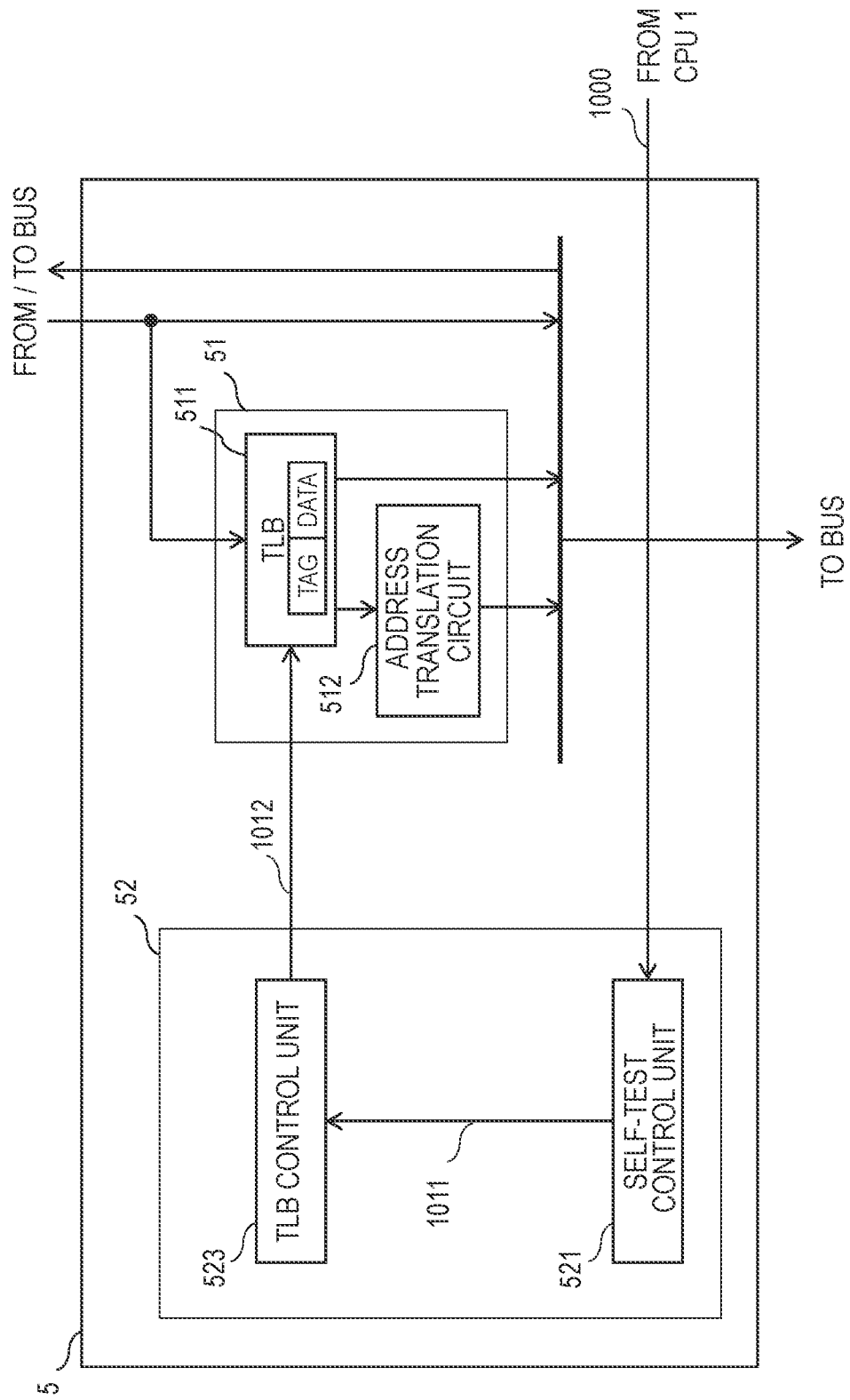
FIG. 3 is a block diagram showing an example of the configuration of the MMU.

FIG. 3 is a block diagram showing an exemplary configuration of the MMU 5. As shown in FIG. 3, the MMU 5 includes an address translation unit 51 and a self-testing unit 52.

The address translation unit 51 includes a translation lookaside buffer (TLB) 511 and an address translation circuit 512, similarly to the address translation circuit 31 of the MMU 3. The TLB 511, like the TLB 311, serves as a cache for page tables stored in the memory 20. The TLB 511 also has page table entries each having tag information and data, like the TLB 311. The number of page table entries in the TLB 511 is greater than the number of page table entries in the TLB 311. The address translation circuit 512 translates the virtual address into a physical address based on the search result outputted from the TLB 511.

The self-test unit 52 differs from the self-test unit 32 of the MMU 3 and includes a self-test control unit 521 and a TLB control unit 523.

Like the self-test control unit 321, the self-test control unit 521 receives the self-test start signal 1000 from the CPU 1. The self-test control unit 521 outputs a self-test instruction signal 1011 to the TLB control unit 523 in response to the self-test start signal 1000.

The TLB control unit 523 receives the self-test instruction signal 1011 and generates a TLB rewrite signal 1012. Based on the TLB rewrite signal 1012, the respective entries in the TLB 511 are rewritten into self-test entries.

Next, referring to FIGS. 1 to 3, address translation operations of the MMUs 3 and 5 in the normal operation will be described.

First, the MMU 3, which is the primary MMU, receives a memory access request from the dedicated processing unit 2. The virtual address of the memory access request is compared with tag information in the TLB 311. If there is tag information corresponding to the virtual address in the TLB 311 (that is 'TLB hit'), the TLB 311 outputs the data corresponding to the hit entry to the address translation circuit 312. The address translation circuit 312 translates the virtual address into a physical address based on the received data. Then, the memory 20 is accessed with the physical address translated by the MMU 3.

On the other hand, if there is no tag information corresponding to the virtual address in the TLB 311 (that is 'TLB miss'), the memory access request is transferred to the MMU 5, that is the secondary MMU. The virtual address of the memory access request is compared with tag information in the TLB 511. If there is tag information corresponding to the virtual address in the TLB 511 (TLB hit), the TLB 511 outputs the data corresponding to the hit entry to the address translation circuit 512. The address translation circuit 512 translates the virtual address into a physical address based on the received data. The memory 20 is then accessed by the physical address translated by the MMU 5.

If there is no tag information corresponding to the virtual address in the TLB 511 (TLB miss), the MMU 5 issues a Page Table Walk (PTW) request. Based on the PTW request, a page table in the memory 20 is accessed to translate the virtual address into a physical address.

Figure 4:
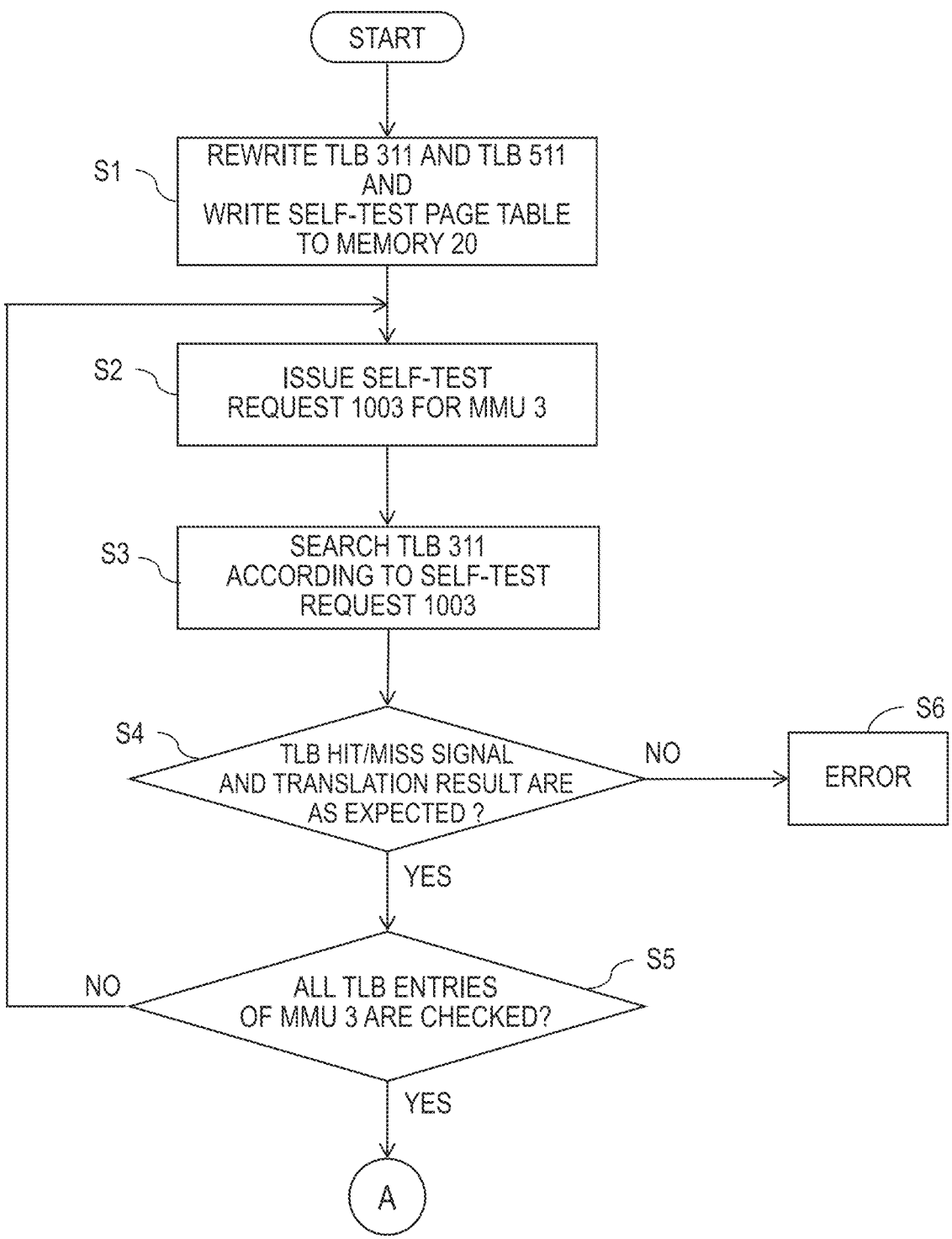
FIG. 4 is a flowchart showing a self-test of the address translation function of the semiconductor device according to the first embodiment.
Figure 5:
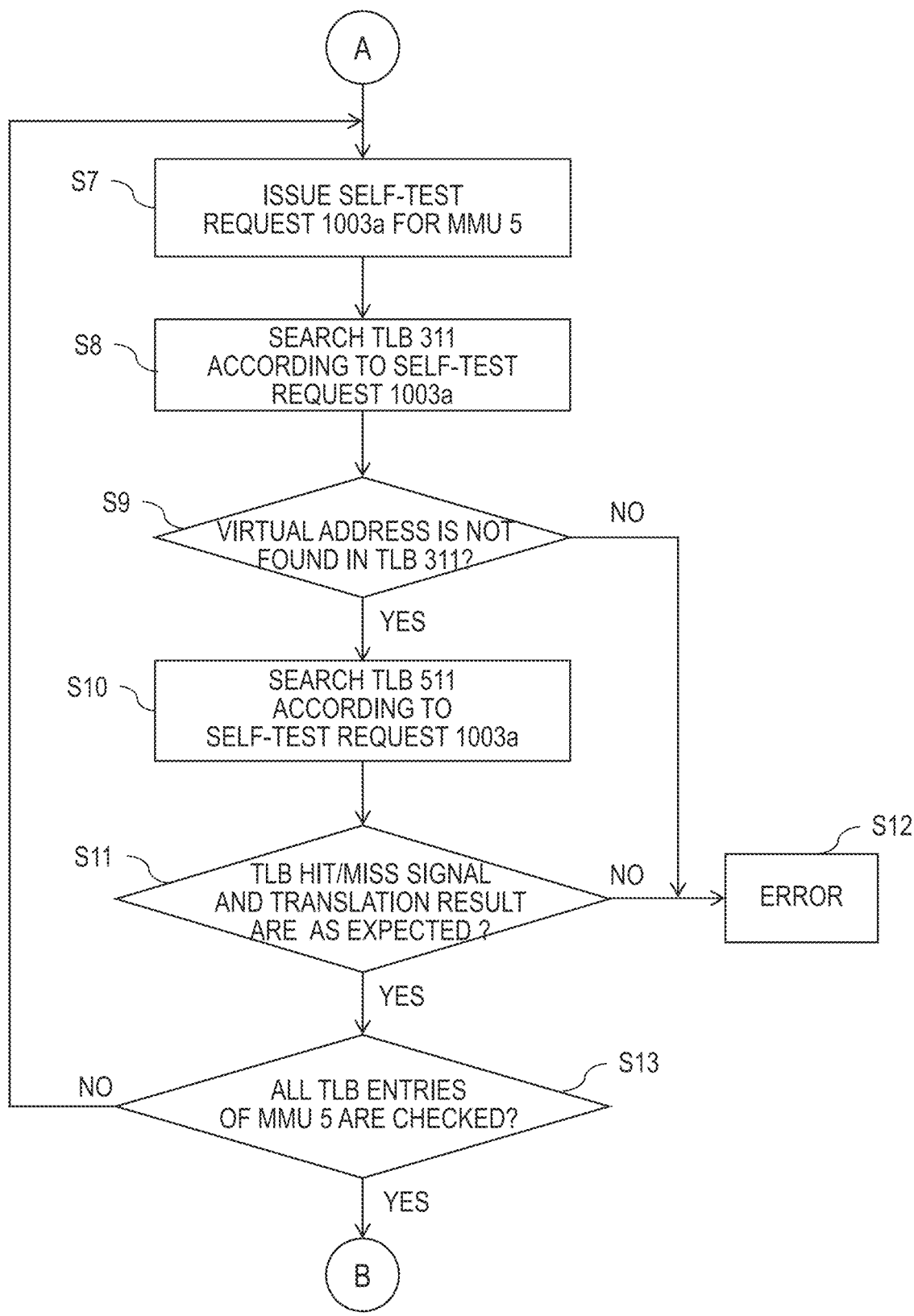
FIG. 5 is a flowchart showing a self-test of the address translation function of the semiconductor device according to the first embodiment.
Figure 6:
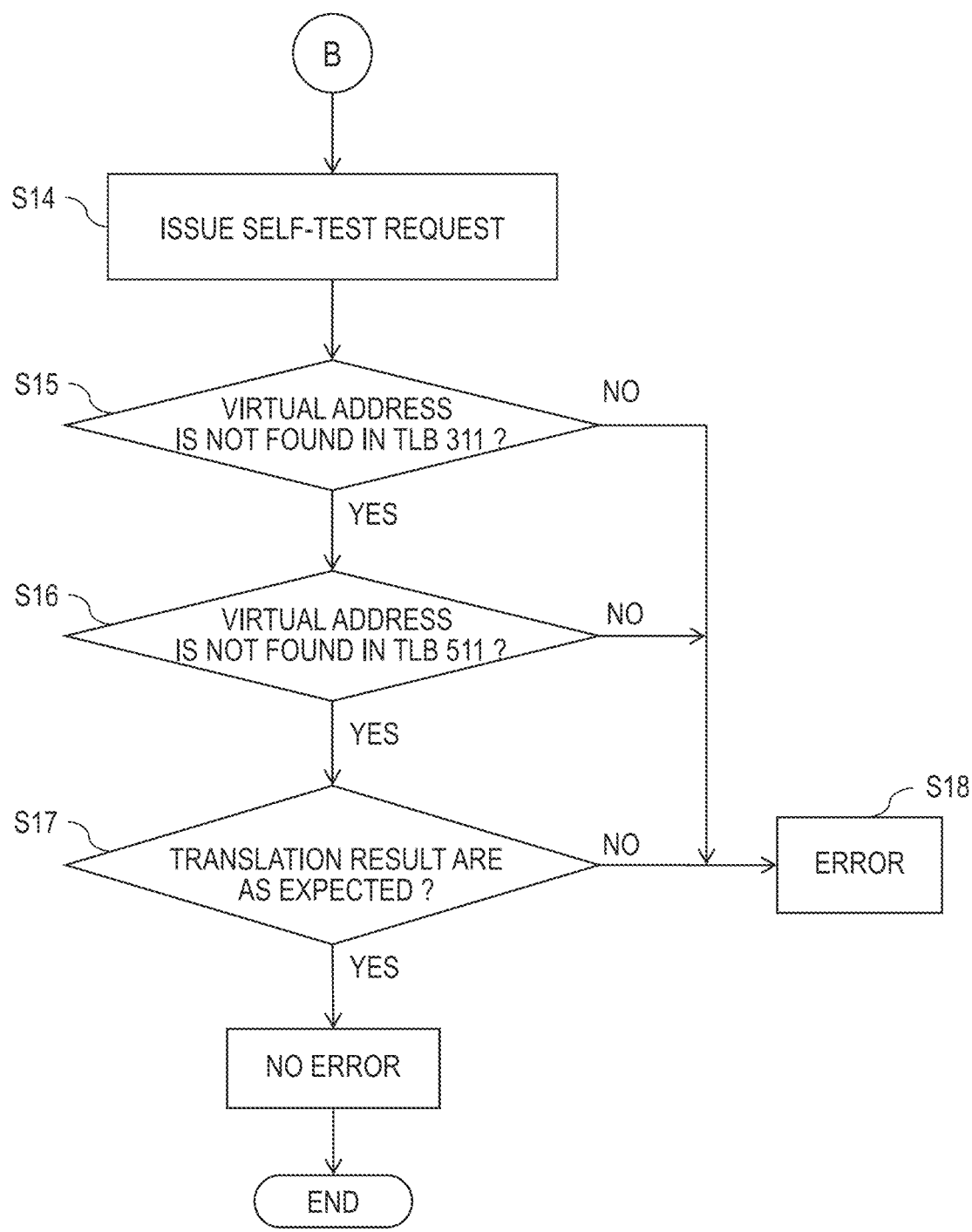
FIG. 6 is a flowchart illustrating a self-test of an address translation function of the semiconductor device according to the first embodiment.

Next, an example of a self-test for the address translation function of the semiconductor device according to the first embodiment will be described. FIGS. 4 to 6 are flowcharts illustrating a self-test for an address translation function of a semiconductor device according to the first embodiment.

First, the CPU 1 outputs the self-test start signal 1000 to the MMUs 3 and 5 in accordance with a software program.

Figure 7:
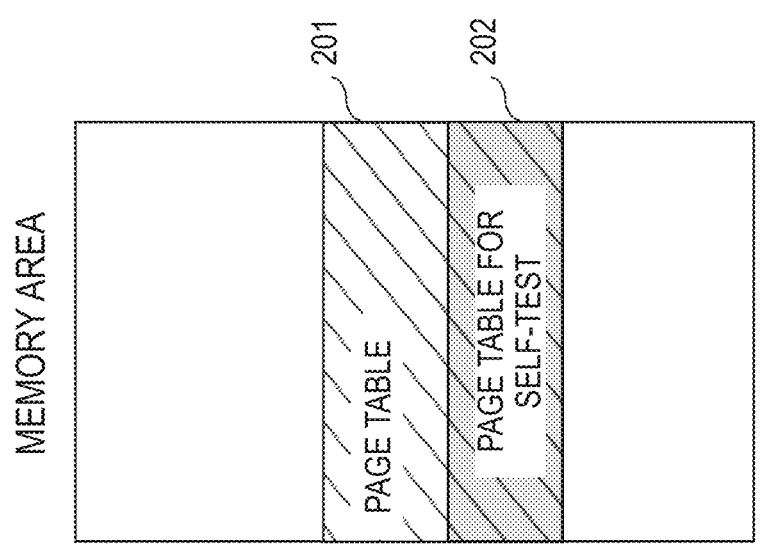
FIG. 7 is a diagram illustrating a configuration of a page table of memory.

Next, the self-test control units 321 and 521 receive the self-test start signal 1000. Thus, the MMUs 3 and 5 enter self-test mode. The self-test control unit 321 outputs the self-test instruction signal 1001 to the request control unit 322 and the TLB control unit 323 in response to the self-test start signal 1000. The TLB control unit 323 rewrites all the entries of the TLB 311 into self-test page table entries in accordance with the self-test instruction signal 1001. Similarly, the self-test control unit 521 outputs the self-test instruction signal 1011 to the TLB control unit 523 in response to the self-test start signal 1000. The TLB control unit 523 rewrites all the entries of the TLB 511 into self-test page table entries in accordance with the self-test instruction signal 1011. Further, as illustrated in FIG. 7, the CPU 1 instructs the memory 20 to rewrite a part of a page table area 201 of the memory 20 to a self-test page table 202 (step S1). The TLBs 311 and 511 and the self-test page table 202 in the memory 20 store page table entries for different virtual addresses, respectively.

The request control unit 322 receives the self-test instruction signal 1001 and issues the memory access request 1003 for self-test. Hereafter, the memory access request 1003 for self-test is referred to as the self-test memory access request 1003. The request control unit 322 issues the self-test memory access request 1003 (Step S2). The self-test memory access request 1003 is set a virtual address that corresponds to tag information in self-test page table entries in the TLB 311, it will be a TLB hit.

The address translation unit 31 receives the self-test memory access request 1003. The TLB 311 in the address translation unit 31 is searched for the entries to see if an entry corresponding to the requested virtual address is present in the TLB 311 (Step S3). Then, the TLB 311 outputs the TLB hit/miss signal 1004 as a search result. If it is a TLB hit, the TLB 311 outputs the data of the hit entry to the address translation circuit 312. The address translation circuit 312 translates the virtual address into a physical address using the data of the hit entry, and outputs the physical address as the address translation result 1005 to the determination unit 324.

The determination unit 324 compares the TLB hit/miss signal 1004 with the expected value of the TLB hit/miss signal and compares the address translation result 1005 with the expected value of the address translation result (step S4). When the TLB hit/miss signal 1004 or the address translation result 1005 differ from the expected values (NO in step S4), the determination unit 324 determines that a failure has occurred in the MMU 3 (step S6). Then, the determination unit 324 generates the self-test determination result signal 1006 indicating that a failure has occurred in the MMU 3 and stores it in the self-test result storage unit 325. The self-test memory access request 1003 is set to a virtual address that hits tag information of the TLB 311 that is rewritten in the page table entry for the self-test. Therefore, if the TLB hit/miss signal indicates a TLB miss, a failure may have occurred in the TLB 311. The determination unit 324 determines that a failure has occurred in the MMU 3. On the other hand, when the TLB hit/miss signal 1004 and the address translation result 1005 match the expected values (YES in step S4), the determination unit 324 stores the self-test result signal 1006 in the self-test result storage unit 325, and proceeds to the next step (step S5).

If the self-test requests for all the entry in the TLB 311 have not been issued, the process returns to step S2 (NO in step S5). Then, the request control unit 322 issues a self-test request 1003 corresponding to the remaining entry in the TLB 311. In this way, the operations from step S2 to step S5 are repeated, and the self-test requests 1003 are sequentially issued such that all the entries of the TLB 311 are sequentially hit.

If the self-test requests for all the entry in the TLB 311 have been issued (YES in step S5), a self-test of the address translation function of the MMU 5 is started. In step S7, the request control unit 322 issues a self-test request 1003*a*. The self-test request 1003*a* includes a virtual address for hitting tag information in the TLB 511 having the self-test page table entries. The virtual address of the self-test request 1003*a* is not hit to the TLB 311 tag information.

The self-test request 1003*a* is supplied to the address translation unit 31. In step S8, the TLB 311 in the address translation unit 31 searches for the entries to see if an entry corresponding to the virtual address set in the self-test request 1003*a* is present. When the entry corresponding to the virtual address does not exist in the TLB 311 (TLB miss) (YES in step S9), the self-test request 1003*a* is transferred to the MMU 5, which is the secondary MMU. The self-test request 1003*a* does not have a virtual address that hits the TLB 311 tag information, so if the search result is TLB hit (NO in step S9), it is determined that a failure has occurred in the TLB 311 (step S12).

The address translation unit 51 in the MMU 5 receives the transferred self-test request 1003*a* and starts the search operation by the TLB 511. The TLB 511 searches for entries corresponding to the virtual address of the self-test request 1003*a* in step S10. The address translation circuit 512 translates the virtual address to a physical address based on the search result of the TLB 511. The search result of the TLB 511 and the address translation result of the address translation circuit 512 are outputted to the determination unit 324 in the MMU 3 as the response information 1008 of the self-test request 1003*a*.

The determination unit 324 determines whether or not the search result of the TLB 511 and the address translation result of the address translation circuit 512 that are included in the response information 1008 are as expected. When the search result and the address translation result are the expected results (YES in Step S11), the determination unit 324 generates the self-test determination result signal 1006 based on the determination result, stores it in the self-test result storage unit 325, and proceeds to the next step (Step S13). On the other hand, when the search result and the address translation result are different from the expected results (NO in Step S11), the determination unit 324 determines that a failure has occurred in the MMU 5. Then, the determination unit 324 generates a self-test determination result signal 1006 indicating that a failure has occurred in the MMU 5, and stores the result in the self-test result storage unit 325.

When the self-test requests 1003*a* corresponding to all the entries of the TLB 511 have been issued (YES in S13), the self-test of the address-translation function using the page table of the memory 20 is started. In step S14, the request control unit 322 issues a self-test request 1003*b* including a virtual address stored in the self-test page table 202 of the memory 20. That is, the self-test request 1003*b* does not include the virtual address corresponding to the TLB 311 entries or the TLB 511 entries.

The self-test request 1003*b* is supplied to the address translation unit 31. The TLB 311 searches for an entry corresponding to the virtual address of the self-test request 1003*b*. If the entry corresponding to the virtual address of the self-test request 1003*b* does not exist in the TLB 311 (TLB miss) (YES in step S15), the self-test request 1003*b* is transferred to the MMU 5. The entry corresponding to the virtual address of self-test request 1003*b* should not exist in the TLB 311. Therefore, when the search result indicates that the entry corresponding to the virtual address of the self-test request 1003*b* exists in the TLB 311 (NO in step S15), it is determined that a failure has occurred in the TLB 311 (step S18).

The address translation unit 51 of the MMU 5 receives the transferred self-test request 1003*b* and performs a search operation by using the TLB 511. The TLB 511 is searched for an entry corresponding to the self-test request 1003*b*. If the entry corresponding to the virtual address of the self-test request 1003*b* does not exist in the TLB 511 (YES in step S16), the MMU 5 issues a page table walk request (PTW request) to the memory 20. In accordance with the PTW request, the address translation information is read from the self-test page table 202 of the memory 20. The MMU 5 translates the virtual address of the self-test request 1003*b* to a physical address based on the address translation information from the self-test page table 202 of the memory 20. The address translation result based on the address translation information from the self-test page table 202 of the memory 20 is output to the determination unit 324 in the MMU 3 as the response information 1008 corresponding to the self-test request 1003*b*. On the other hand, there should be no entry in the TLB 511 corresponding to the virtual address of the self-test request 1003*b*. Therefore, when the search result that indicates that the entry corresponding to the virtual address of the self-test request 1003*b* exists on the TLB 511 is obtained (NO in Step S16), it is determined that a failure has occurred in the TLB 511 (Step S18).

The determination unit 324 determines whether or not the address translation result included in the response information 1008 is an expected result. If the result of the address translation is as expected (YES in step S17), the self-test of the address translation function of the semiconductor device 10 is completed. If the address translation result differs from the expected result (NO in Step S17), it is determined that there is a failure in the address translation function using the self-test page table 202 of the memory 20, for example, the path from the MMU 3 to the memory 20 (Step S18).

As described above, according to the present embodiment, the self-test of the address translation function can be performed for each MMU. The self-test result of each MMU is stored in the self-test result storage unit 325. The CPU 1 reads the self-test result information 1007 stored in the self-test result storage unit 325, and resets or resumes the address translation function in order to secure the safety of the data processing apparatus 100. Since the self-test result information 1007 includes the self-test result of each MMU, the CPU 1 can recognize which of the MMUs has a failure. Accordingly, the CPU 1 can set the range to which the reset or resume operation should be performed based on the self-test result information 1007. For example, if the self-test result information 1007 indicates that only the MMU 3 has an entry at which a failure occurs, the CPU 1 issues a system reset signal 1010 only to the MMU 3. If the self-test result information 1007 indicates that only the MMU 5 has an entry at which a failure occurs, the CPU 1 issues a system reset signal 1010 to the MMU 5. In this manner, it is possible to set the MMU to which the reset or resume operation is to be performed based on the self-test result of each MMU.

A failure may occur on the data bus between the lower-level MMU and the upper-level MMU. Therefore, if the self-test result information 1007 indicates that the MMU 5 has an entry at which a failure occurs, the CPU 1 may issue the system reset signal 1010 not only to the MMU 5 but also to the lower-level MMU 3.

As described above, according to the first embodiment, it is possible to execute the self-test of each of the plurality of MMUs having the hierarchical structure, and to output the self-test result of the MMU of each hierarchical structure. As a result, it is possible to specify which of the MMUs has occurred a failure. Therefore, it is possible to set the range in which the reset or resume operation is to be performed in accordance with the specified failure location. Thus, the operation time of the reset or resume operation caused by the detection of failure of the address translation function is reduced.

The self-test units of the MMUs start the self-test according to an instruction from the CPU 1 rather than the dedicated processing unit 2 which is the issuer of the memory access request. That is, the execution of the self-test of each MMU can be controlled by a software program. This makes it possible to arbitrarily set the execution timing of the self-test of the MMU, thereby reducing the difficulty of system design.

According to the first embodiment, the semiconductor device provided with the MMUs having two levels has been described, but the present invention is not limited thereto. Further, the semiconductor device 10 may have a plurality of processing units for performing memory access using a virtual address.

Modified Example

As described above, in the address translating function of the semiconductor device 10, the self-tests are executed in the order of the MMU 3, the MMU 5 and the memory 20 in response to the self-test start signal 1000 outputted from the CPU 1. However, the self-test start signal 1000 may include not only an instruction to start execution of the self-test but also information specifying an MMU to be a target for executing the self-test. This allows a self-test to be performed for each MMU.

For example, it is assumed that the CPU 1 outputs the self-test start signal 1000 having information specifying the MMU 3 as a target of the self-test. The self-test control unit 321 in the MMU 3 receives the self-test start signal 1000 and outputs the self-test instruction signal 1001 to the TLB control unit 323. In response to the self-test instruction signal 1001, the TLB control unit 323 rewrites the entries of the TLB 311 into self-test entries. The self-test control unit 321 of the MMU 3 instructs the request control unit 322 to issue a request for a self-test of the MMU 3, which is the target of the self-test, in response to the self-test start signal 1000. The self-test for the MMU 3 is executed. However, in the present modified example, the request control unit 322 does not issue a self-test request for the MMU 5 that is not the target of the self-test. Although the self-test control unit 521 of the MMU 5 also receives the self-test start signal 1000, the self-test control unit 521 of the MMU 5 does not issue the self-test instruction signal 1011 because the MMU 5 is not the target of the self-test. Therefore, the entries of the TLB 511 are not rewritten to the self-test entries.

During execution of the self-test, the memory access request issued from the dedicated processing unit 2 cannot be processed. Therefore, by setting the target MMU of the self-test as in the present modified example, the time required for the self-test is shortened.

Figure 8:
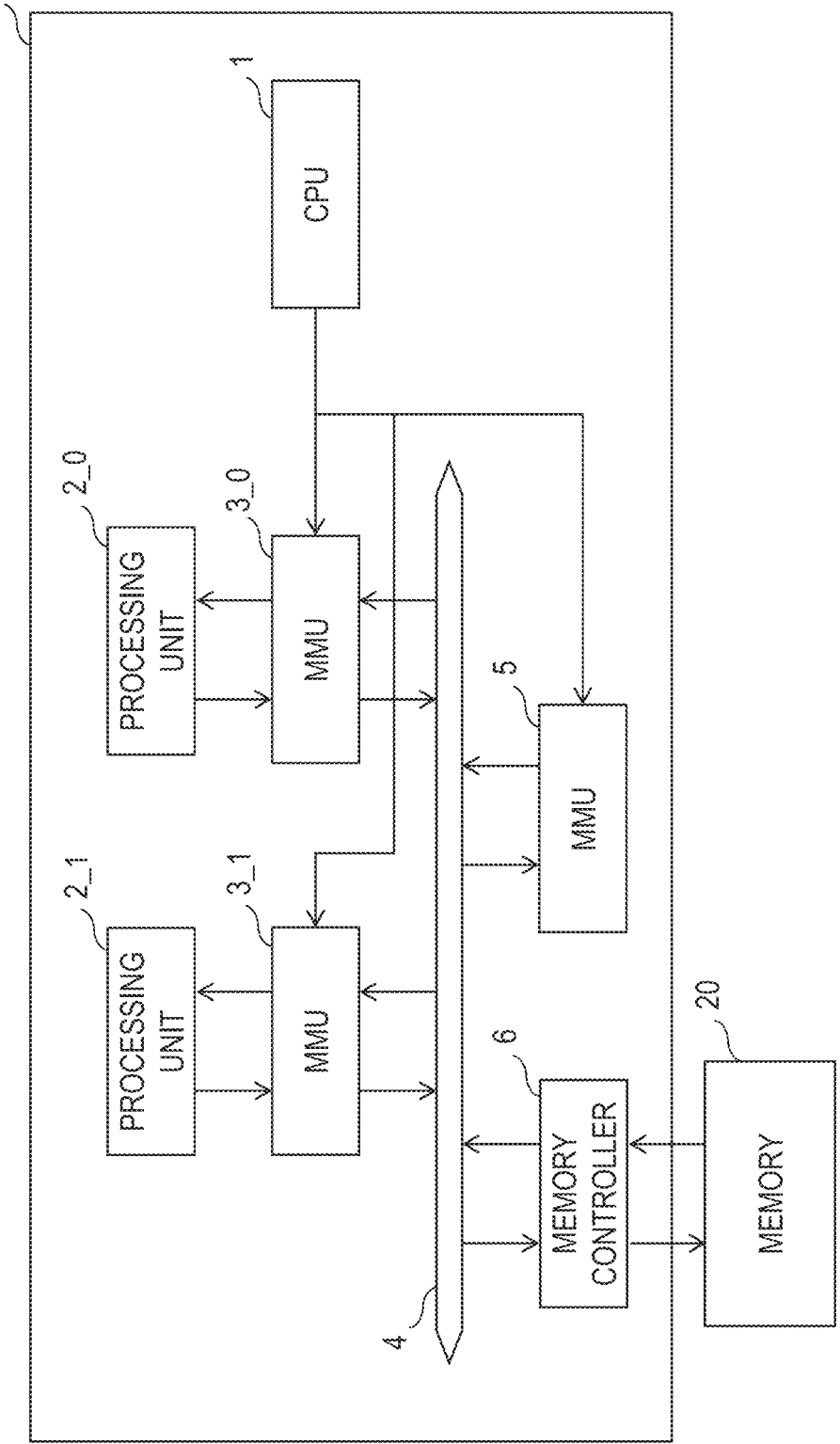
FIG. 8 is a block diagram illustrating a modification according to the first embodiment.

Further, the semiconductor device 10 may include a plurality of dedicated processing unit 2. Then, the primary MMU is provided for each dedicated processing units, the secondary MMU may be shared by the dedicated processing units. For example, as shown in FIG. 8, a semiconductor device 10a includes a plurality of dedicated processing units 2_0 and 2_1. MMUs 3_0 and 3_1 as the primary MMU may be provided for the dedicated processing units 2_0 and 2_1, respectively. The MMU 5 may be provided as a secondary MMU for the dedicated processing units 2_0 and 2_1. In such a configuration, as described in the first embodiment, when the self-test of the address-translation function is executed in response to the memory access request from the dedicated processing unit 2_0, the MMUs 3_0 and 5 are set to the self-test mode. Therefore, while the self-test is being performed, the MMU 5 cannot perform address translation with respect to the memory access request from the dedicated processing unit 2_1. Therefore, the execution of the self-test may affect the performance of the entire system.

However, by setting the target of the self-test for each MMU as in the modified example, it is possible to reduce the influence of the execution of the self-test on the performance of the entire system. For example, when the target of executing the self-test is set to the MMU 3_0 among the address translation functions associated with the dedicated processing unit 2_0, the MMU 5 can perform the normal operation. Therefore, the memory access request from the dedicated processing unit 2_1 can be processed. That is, it is not necessary to stop the operation of the dedicated processing unit 2_1 by executing the self-test of the MMU 3_0. Therefore, performance degradation of the entire system due to execute of the self-test can be prevented.

Second Embodiment

Figure 9:
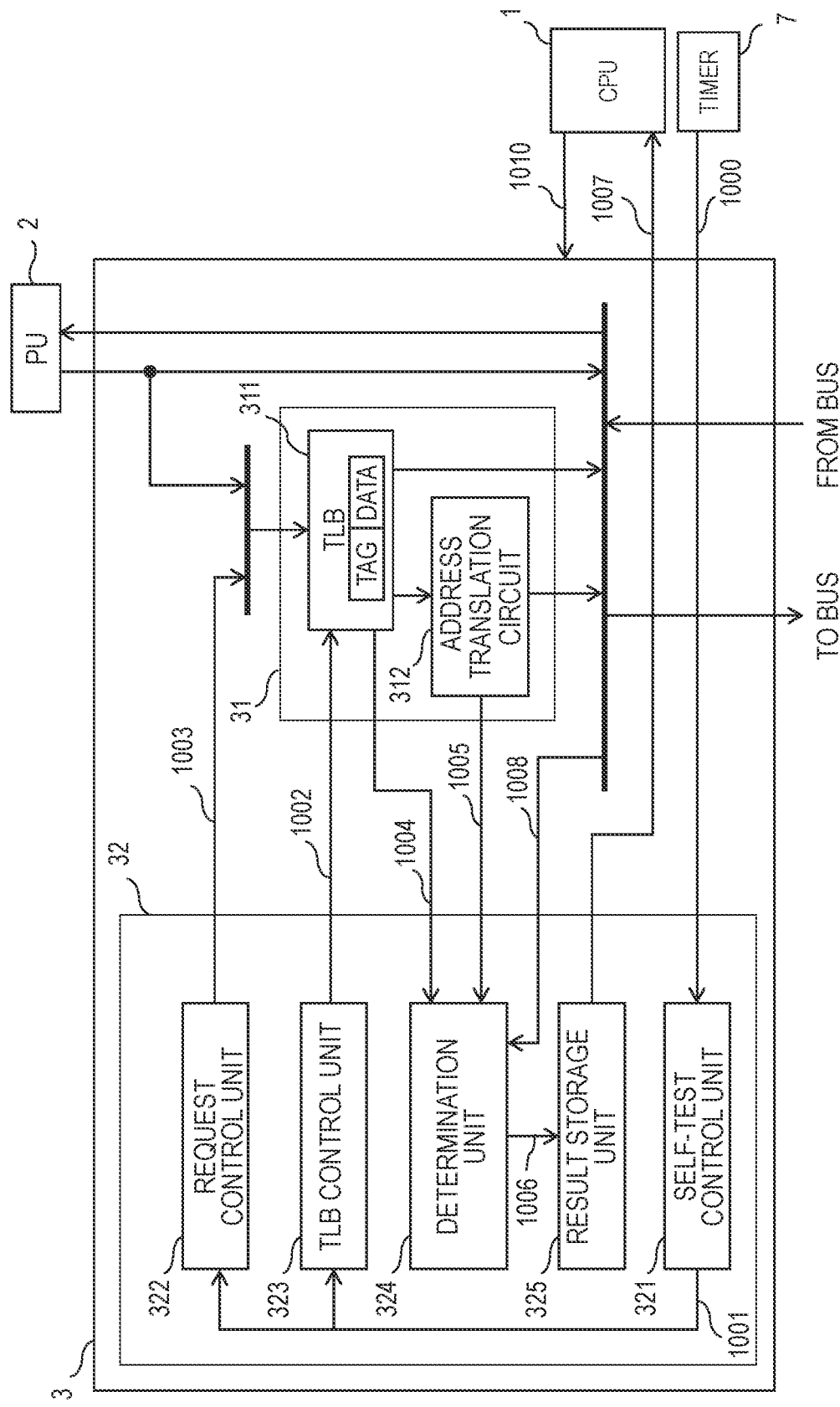
FIG. 9 is a block diagram illustrating a semiconductor device according to second embodiment.

The semiconductor device according to a second embodiment will be described with reference to FIG. 9. The second embodiment differs from the first embodiment in that the self-test start signal 1000 is supplied from a timer module 7. Except for this, the description is omitted because it is the same as that of the first embodiment.

As described above, in the first embodiment, the self-test start signal 1000 is output from the CPU 1. On the other hand, in the second embodiment, the self-test start signal 1000 is output from the timer module 7. That is, in the second embodiment, the self-test units for the MMUs 3 and 5 receive the self-test start signal 1000 outputted from the timer module 7 at predetermined time periods. Therefore, the self-tests of the address translation functions of the semiconductor device 10 are performed at the predetermined time period, and a failure can be periodically confirmed. This enhances the safety of the data processing apparatus.

First Modified Example of Second Embodiment

Figure 10:
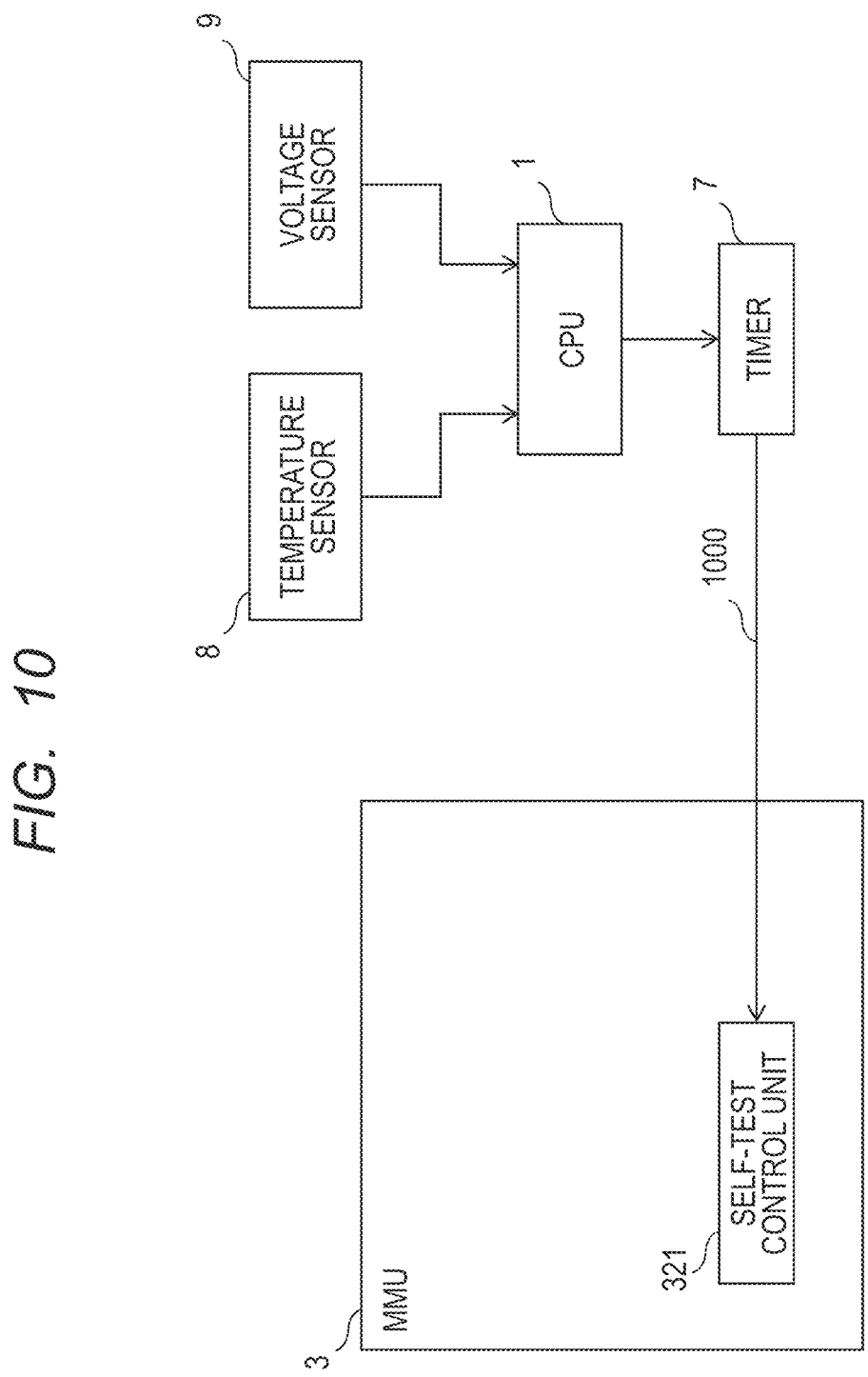
FIG. 10 is a block diagram for explaining a semiconductor device according to modified example of a second embodiment.

FIG. 10 is a diagram for explaining a semiconductor device according to a first modified example of the second embodiment. In the second embodiment, the timer module 7 outputs the self-test start signal 1000 at predetermined time periods. The period for outputting the self-test start signal 1000 may be controlled. As shown in FIG. 10, a temperature sensor 8 and a voltage sensor 9 are further provided in the semiconductor device. The period of the self-test start signal 1000 from the timer module 7 may be controlled in response to the monitoring result of the temperature sensor 8 and the voltage sensor 9. In FIG. 10, only the elements used in the description of the present modified example are shown, and the other elements as shown in FIG. 1 are omitted.

According to the first modified example, the temperature sensor 8 measures the temperature inside the semiconductor device. The CPU 1 receives the measurement result of the temperature sensor 8 and determines whether the high-temperature condition of the semiconductor device continues for a predetermined period or longer based on the measurement result. When the high-temperature condition of the semiconductor device is determined to continue for a predetermined period or more, the CPU 1 controls the timer module 7 to change the period for outputting the self-test start signal 1000. For example, the timer module 7 is controlled to increase the frequency of outputting the self-test start signal 1000. The semiconductor device may further include a test temperature setting register (not shown) for setting a temperature value for starting the control of the timer module 7.

Further, the voltage sensor 9 measures the operating voltage in the semiconductor device. The CPU 1 receives a measurement result. The CPU 1 controls the timer module 7 when it determines that the semiconductor device is in a low voltage state or a high voltage state for a long time. For example, the timer module 7 is controlled to increase the frequency of outputting the self-test start signal 1000. The semiconductor device may further include a test voltage setting register (not shown) for setting the voltage value for starting the control of the timer module 7.

Thus, the condition of the semiconductor device is monitored by the temperature sensor and the voltage sensor. Based on the monitor result, it is possible to execute the self-test of the address translation function. That is, the self-test is performed in accordance with the operating environment of the semiconductor device. As a result, the failure detection rate can be improved.

Incidentally, in the first modified example, it has been described an example in which both the temperature sensor 8 and the voltage sensor 9 is provided, but not limited thereto. Either one of the temperature sensor 8 and the voltage sensor 9 may be used for monitoring the condition of the semiconductor device to control the execution time period of the self-test in accordance with the monitor result.

Second Modified Example of Second Embodiment

The period of the self-test start signal 1000 outputted by the timer module 7 may be changed according to the total use time of the semiconductor device. The total usage time is held in accordance with the software program and the CPU 1 controls the timer module 7 to change the frequency of execution of the self-test if the total usage time exceeds a predetermined time.

Third Embodiment

Figure 11:
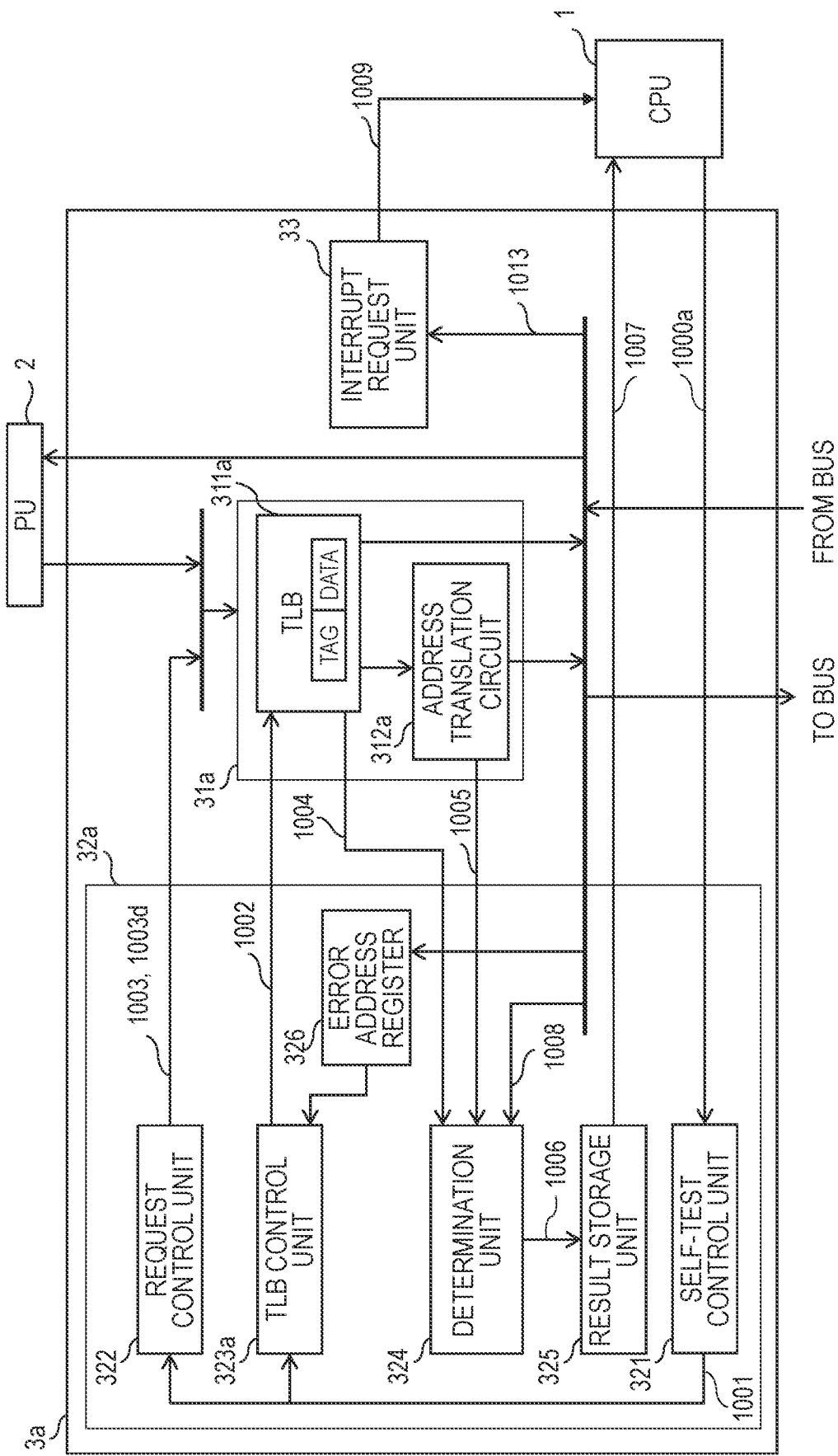
FIG. 11 is a block diagram showing an example of the configuration of an MMU according to a third embodiment.
Figure 12:
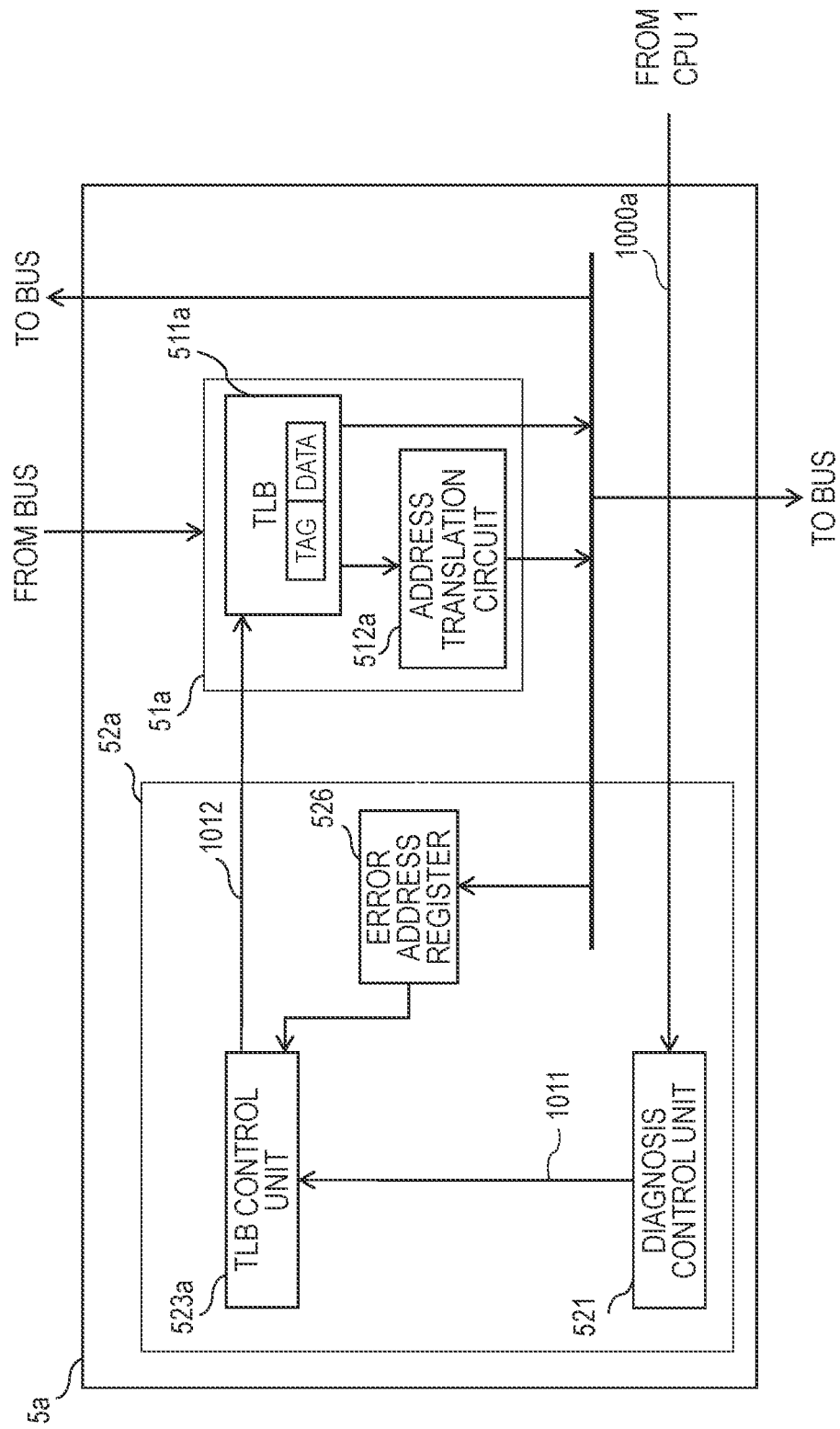
FIG. 12 is a block diagram showing an example of the configuration of an MMU according to the third embodiment.

Next, a third embodiment will be described. In the third embodiment, MMUs 3*a* and 5*a*, which are another form of the MMUs 3 and 5 according to the first embodiment, will be described. FIGS. 11 and 12 are block diagrams showing examples of the configurations of the MMUs 3*a* and 5*a* in the semiconductor device 10*a* according to the third embodiment, respectively. In the third embodiment, the configurations other than the MMU 3*a* and the MMU 5*a* in the semiconductor device 10*a* may be the same as that shown in FIG. 1. Therefore, their descriptions are omitted hereafter.

FIG. 11 is a block diagram showing an exemplary configuration of the MMU 3*a*. The MMU 3*a* differs from the MMU 3 described in the first embodiment (see FIG. 2) in that it further includes an interrupt request unit 33. Furthermore, the MMU 3*a* differs from the MMU 3 (see FIG. 2) described in the first embodiment in that a address translation unit 31*a* is provided in place of the address translation unit 31, and a self-test unit 32*a* is provided in place of the self-test unit 32. In the address translation unit 31*a* and the self-test unit 32*a* shown in FIG. 11, the configurations having the same functions as those in FIG. 2 are denoted by the same reference numerals, and descriptions thereof are omitted.

Like the TLB 311 in the first embodiment, a TLB 311*a* of the address translation unit 31*a* has a plurality of page table entries for translating virtual addresses to physical addresses, and functions as a cache of page tables stored in the memory 20. Each page table entry has secure information in addition to tag information and data. The secure information is information relating to an access right to a dedicated processing unit which is a memory access request source. For example, whether or not the memory access request source may access the memory area specified by the virtual address (for example, read only, write only, or read and write possible) is set as the secure information. The TLB 311*a* compares the tag information with the virtual address included in the memory access request. Further, the request information (e.g., read/write information) set in the memory access request is compared with the secure information of the TLB 311*a*. Even if the TLB 311*a* has a page table entry corresponding to the virtual address (TLB hit), when the secure information in the page table entry does not match the request information of the memory access request, the address translation error notification signal 1013 is output as an address translation error. On the other hand, the TLB 311*a* outputs the search result of the TLB 311*a* to the address translation circuit 312, if the TLB 311 has the page table entry corresponding to the virtual address of the memory access request and the secure information of the page table entry matches the request information of the memory access request.

The self-test unit 32a is different from the self-test section 32 shown in FIG. 2 in that it further includes an error address register 236. The error address register 326 stores the virtual address of the memory access request determined to be an address translation error by the address translation unit 31a and the address information of the entry.

A TLB control unit 323a reads out the virtual address and the address information of the entry stored in the error address register 326 when receiving the self-test instruction signal 1001 output from the self-test control unit 321. The TLB control unit 323a generates a self-test page table entry based on the read virtual address. The self-test page table entry includes a tag information corresponding to the virtual address read from the error address register 326. The TLB control unit 323a outputs a TLB rewrite signal 1002 in order to rewrite an entry corresponding to address information of the entry from the error address register 326 with the self-test page table entry.

The interrupt request unit 33 receives the address translation error notification signal 1013 from the address translation unit 31a. Then, the interrupt request unit 33 outputs the address translation error interrupt notification signal 1009 to the CPU 1 in response to the address translation error notification signal 1013.

Next, the MMU 5a in the third embodiment shown in FIG. 12 will be described. FIG. 12 is a block diagram showing an exemplary configuration of the MMU 5a according to the third embodiment. The MMU 5a differs from the MMU 5 shown in FIG. 3 in that it includes an address translation unit 51a instead of the address translation unit 51, a self-test unit 52a instead of the self-test unit 52, and an error address register 526. In the address translation unit 51a and the self-test unit 52a shown in FIG. 12, the configurations having the same functions as those in FIG. 3 are denoted by the same reference numerals, and descriptions thereof are omitted.

A TLB 511a of the address translation unit 51a functions as a cache of page tables stored in the memory 20 in the same manner as the TLB 311a. Each page table entry in the TLB 511a has secure information in addition to tag information and data, as well as page table entries of the TLB 311a. Even if the page table entry corresponding to the virtual address of the memory access request exists in the TLB 511a, when the secure information in the page table entry does not match the request information of the memory access request, the TLB 511a outputs an address translation error notification signal. The address translation error notification signal is sent back to the MMU 3a as a response to the memory access request given to the MMU 5a.

The self-test unit 52a includes the self-test control unit 521, a TLB control unit 523a, and the error address register 526.

Like the error address register 326 of FIG. 11, the error address register 526 stores the virtual address of the memory access request determined to be an address translation error in the address translation unit 51a and the address information of the entry.

The TLB control unit 523a reads the virtual address and the entry address information stored in the error address register 526 in response to the self-test instruction signal 1011 output from the self-test control unit 521. The TLB control unit 523a generates a self-test page table entry having tag information generated based on the read virtual address. The TLB control unit 523a outputs the TLB rewrite signal 1012 in order to rewrite an entry corresponding to the address information of the entry read from the error address register 526 with the self-test page table entry.

Figure 13:
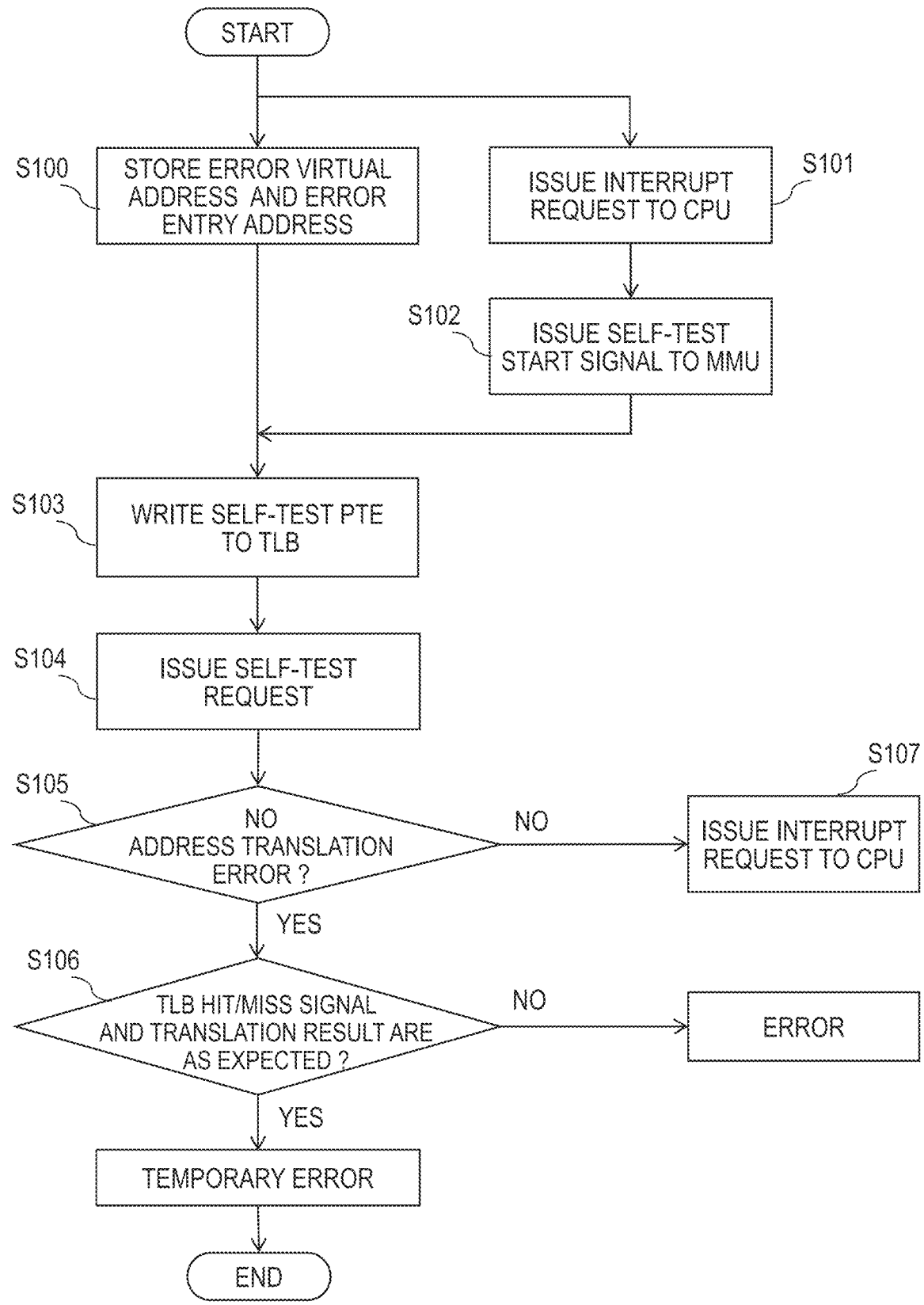
FIG. 13 is a flowchart showing a self-test of the address translation function of the semiconductor device according to the third embodiment.

Next, an example of a self-test operation for the address translation function of the semiconductor device according to the third embodiment will be described. The semiconductor device according to the third embodiment executes a self-test for the MMU in response to occurrence of an address translation error. FIG. 13 is a flowchart for explaining a self-test when an address translation error occurs in the semiconductor device according to the third embodiment. Hereinafter, it will be described the case in which an address-translation error occurs in the MMU 5a. The MMU 3a, which is the primary MMU, receives a memory access request from the dedicated processing unit 2. If there is no page table entry corresponding to the virtual address of the memory access request in the TLB 311a of the MMU 3a, the memory access request is transferred to the MMU 5a, which is the secondary MMU.

The MMU 5a receives the memory access request. The TLB 511a searches for a page table entry corresponding to the virtual address of the memory access request. The TLB 511a has the page table entry corresponding to the virtual address of the memory access request (TLB hit). However, the request information of the memory access request and the secure information of hit page table entry do not match. Thus, the TLB 511a outputs an address translation error notification signal.

When an address translation error occurs, the virtual address and the address information of the entry of the memory access request determined to be an address translation error are stored in the error address register 526 (step S100). The address translation error notification signal outputted from the TLB 511a is sent back to the MMU 3a as a response to the memory access request given to the MMU 5a. The address translation error notification signal 1013 is received by the interrupt requesting unit 33 in the MMU 3a. The interrupt request unit 33 outputs an interrupt request 1009 to the CPU 1 in response to the address translation error notification signal 1013 (step S101). In response to the interrupt request 1009, the CPU 1 outputs the self-test start signal 1000 to the MMU 3a and the MMU 5a in step S102. Thus, the MMU 3a and the MMU 5a enter a self-test mode.

The self-test control unit 321 of the MMU 3a and the self-test control unit 521 of the MMU 5a output self-test instruction signals 1001 and 1011 to the TLB control units 323a and 523a in response to the self-test start signal 1000, respectively.

The TLB control units 323a and 523a receives the self-test instruction signals 1001 and 1011, and read the virtual addresses stored in the error address registers 326 and 526, respectively. The TLB control units 323a and 523a each generate a self-test page table entry having tag information based on the read virtual addresses. The generated self-test page table entry is written based on the address information of the entry having an error read from the error address registers 326 and 526 of the TLB 311a and 511a. Therefore, in this case, the entry in which an address translation error has occurred in the TLB 511a is rewritten with the page table entry generated by the TLB control unit 523a (step S103).

Next, a self-test request 1003d is issued from the request control unit 322 in step S104. In the self-test request 1003d, a virtual address is set. The virtual address of the self-test request 1003d corresponds to the entry in which an address translation error has occurred. In other words, by the virtual address of the self-test request 1003d, it is expected that the entry in which an address translation error has occurred in the TLB 511a is a hit. Therefore, the virtual address of the self-test request 1003*d* is not address-translated in the MMU 3*a*, and the self-test request 1003*d* is transferred to the MMU 5*a*.

The MMU 5*a* performs address translation based on the self-test request 1003*d*. When an address translation error is detected again in the address translation by the MMU 5*a* (NO in S105 of steps), an address translation error notification is outputted. Therefore, the address translation error is sent back to the MMU 3*a* as the response data of the self-test request 1003*d*. Then, the MMU 3*a* interrupt requesting unit 33 outputs the translation error interrupt notification signal 1009 to the CPU 1 in response to the address translation error notification signal 1013 in step S107. On the other hand, if no address translation error is detected (YES in step S105), the MMU 5*a* TLB hit/miss result and the address translation result are sent to the MMU 3*a* as the response information 1008 of the self-test request 1003*d*, and are inputted to the MMU 3*a* determination unit 324.

In step S106, the determination unit 324 determines whether the TLB hit/miss result and the address-translation result included in the response information 1008 are the expected TLB hit/miss result and the expected address-translation result. When the TLB hit/miss result and the address-translation result are not the results as expected (NO in step S106), it is determined that a failure has occurred in the TLB 511*a*, and a self-test determination result signal 1006 indicating that a failure has occurred in the MMU 5*a* is generated and stored in the self-test result storage unit 325. On the other hand, if the TLB hit/miss result and the address translation result are the expected results (YES in step S106), the address translation error is determined to be a transient failure of the TLB 511*a*.

The CPU 1 may determine that a permanent failure has occurred in the MMU 3*a* or 5*a* upon receipt of the translation error interrupt notification 1009 with the MMU 3*a* and 5*a* transitioning to the self-testing mode. On the other hand, if the CPU 1 does not receive the translation error interrupt notification signal 1009 while the MMU 3*a* and the MMU 5*a* enter the self-test mode, and if the MMU 3*a* and the MMU 5*a* failure information is not obtained from the self-test determination result signal, it determines that the address translation error is a transient failure of the TLB.

As described above, according to the third embodiment, the self-test of the MMU is performed based on the address translation error. This makes it possible to determine whether the cause of the error of the TLB is a transient failure or a permanent failure. For example, if the CPU 1 determines that the cause of the failure of the TLB is a transient failure, it may return to a normal operation after resetting the TLB. In addition, the CPU 1 controls the entire system including the semiconductor device so that the entire system changes to a safe state when the cause of the failure of the TLB is a permanent failure. In this manner, by determining whether the cause of the failure of the address translation error is transient or permanent, it is possible to execute processing suitable for the cause of the failure.

Fourth Embodiment

Figure 14:
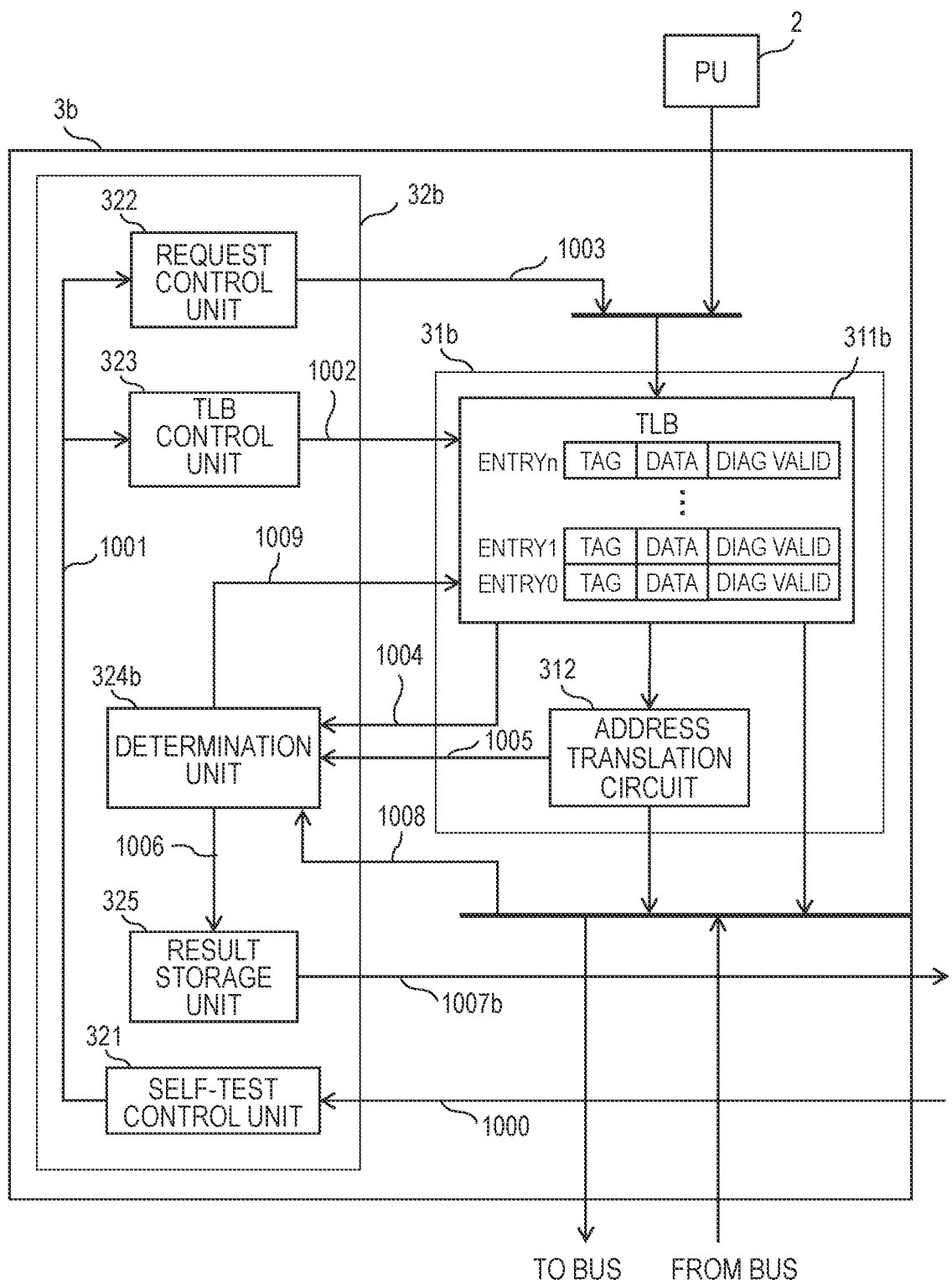
FIG. 14 is a block diagram showing an example of the configuration of an MMU according to a fourth embodiment.

Next, a fourth embodiment will be described. In the fourth embodiment, a the MMU 3*b*, which is another form of the MMU 3 according to the first embodiment, will be described. FIG. 14 is a block diagram showing an exemplary configuration of the MMU 3*b* included in the semiconductor device 10*b* according to the fourth embodiment. The MMU 3*b* includes an address translation unit 31*b* and a self-testing unit 32*b*. The address translation unit 31*b* differs from the address translation unit 31 of the first embodiment in that it includes a TLB 311*b* instead of the TLB 311. The self-test section 32*b* differs from the self-test section 32 of the first embodiment in that it includes a determination section 324*b* instead of the determination section 324. In the address translation unit 31*b* and the self-test unit 32*b* shown in FIG. 14, the configurations having the same functions as those in FIG. 2 are denoted by the same reference numerals, and their descriptions are omitted.

The TLB 311*b* of the address translation unit 31*b*, like the TLB 311 in the first embodiment, has a plurality of page table entries for translating virtual addresses to physical addresses, and functions as a cache of page tables stored in the memory 20. Each page table entry contains valid flag data in addition to tag information and data. The valid flag data indicates whether the entry is valid or invalid.

The determination unit 324*b* of the self-test unit 32*b* receives the TLB hit/miss signal 1004 and the address translation result 1005, and determines the self-test result of the address translation function of the address translation unit 31*b*, similarly to the TLB 324 of the first embodiment. The determination unit 324*b* further outputs valid flag control signals 1009 for setting the valid flag data of the TLB 311*b* based on the self-test determination result. For example, the determination unit 324*b* outputs the valid flag control signal 1009 to set valid flag data indicating invalidity for an entry determined to have failed as a result of the self-test determination. Thus, the entry in which the failure has occurred is set to invalid. The MMU 3*b* performs address-translation operation using valid entries other than the invalid entries in the TLB 311*b*. The MMU 3*b* cannot use all entries in the TLB, but can continue address translation operations with some entries, thus allowing time for the system to transition to a safe state.

In addition to the self-test result, the determination unit 324*b* also stores information on whether or not valid flag data has been set in the self-test result storage unit 325. The information on the self-test result and the valid flag data setting is transferred to the CPU 1 as a self-test result information 1007*b*. The CPU 1 can cause the system to transition to an appropriate operating mode based on the self-test result information 1007*b*, which includes information about the valid flag data setting. For example, the CPU 1 may determine whether to continue the system operation or to determine the operation mode to be transited according to the number of entries for which valid flag data indicating invalid is set.

Although the MMU 3*b* of the primary MMU has been described, the TLBs of the upper MMUs have valid flag data, similarly to the TLB 311*b*, and may be set based on the results of the self-tests.

Although the invention made by the present inventor has been specifically described based on the embodiment, the present invention is not limited to the embodiment described above, and it is needless to say that various modifications can be made without departing from the gist thereof.

Further, in the first to fourth embodiment, an example in which the address translation function is composed of an MMU consisting of two levels has been described, but it may have a hierarchical structure of two or more levels. In addition, the dedicated processing units may have a hierarchical structure, and the MMUs may have a hierarchical structure that corresponds to the dedicated processing units of the hierarchical structure.

What is claimed is:

1. A semiconductor device, comprising:
a first memory management unit configured to receive a memory access request with a virtual address; and
a second memory management unit coupled to the first memory management unit,
wherein the first memory management unit is configured to:
translate the virtual address of the memory access request into a physical address; and
perform a first self-test on the first memory management unit itself;
wherein the second memory management unit is configured to:
translate the virtual address of the memory access request into the physical address when the virtual address of the memory access request is not translated by the first memory management unit;
perform a second self-test on the second memory management unit itself;
wherein the first memory management unit further comprises a result storage storing a first self-test result that indicates a result of the first self-test unit and a second self-test result that indicates a result of the second self-test unit.

2. The semiconductor device according to claim 1, further comprising:
a central processing unit (CPU),
wherein the CPU is configured to read the first self-test result and the second self-test result from the result storage, to issue a first reset signal to the first memory management unit based on the first self-test result, and to issue a second reset signal to the second memory management unit based on the second self-test result.

3. The semiconductor device according to claim 1, further comprising:
a central processing unit (CPU) configured to output a self-test start signal to the first memory management unit and the second memory management unit,
wherein, in response to receiving the self-test start signal, the first memory management unit and the second memory management unit perform the first self-test and the second self-test, respectively.

4. The semiconductor device according to claim 3,
wherein the first memory management unit and the second memory management unit each includes:
a translation lookaside buffer having a plurality of page table entries that is a part of a page table of a memory; and
an address translation circuit configured to translate the virtual address into the physical address based on a result of the translation lookaside buffer, and
wherein each of the first memory management unit and the second memory management unit is configured to rewrite the page table entries of the translation lookaside buffer into page table entries for self-test in response to receiving the self-test start signal.

5. The semiconductor device according to claim 4,
wherein a first page table entries for self-test stored in the translation lookaside buffer of the first memory management unit is different from a second page table entries for self-test stored in the translation lookaside buffer of the second memory management unit.

6. The semiconductor device according to claim 3,
wherein the CPU is configured to output the self-test start signal based on a software program.

7. The semiconductor device according to claim 3,
wherein the self-test start signal includes information indicating which of the first memory management unit or the second memory management unit is a target of a self-test.

8. The semiconductor device according to claim 3, further comprising a timer module, the timer module outputting the self-test start signal in a predetermined period.

9. The semiconductor device according to claim 8, further comprising a sensor for monitoring an operation environment of the semiconductor device,
wherein the predetermined period depends on a detection result of the sensor.

10. The semiconductor device according to claim 9,
wherein the sensor is a temperature sensor.

11. The semiconductor device according to claim 9,
wherein the sensor is a voltage sensor.

12. The semiconductor device according to claim 3,
wherein, when an address translation result of the first memory management unit or the second memory management unit for the received memory access request indicates an address translation error, the first memory management unit is configured to request the CPU to output the self-test start signal.

13. The semiconductor device according to claim 12,
wherein the first memory management unit and the second memory management unit each includes:
a translation lookaside buffer having a part of a page table in the memory; and
an address translation circuit configured to translate the virtual address into the physical address based on a search result of the translation lookaside buffer,
wherein the first memory management unit is configured to issue a self-test memory access request in response to the self-test start signal, and
wherein the self-test access request is set to correspond to a page table entry resulted in an address translation error as a self-test result of the first self-test or the second self-test.

14. The semiconductor device according to claim 1,
wherein the first memory management unit and the second memory management unit each includes:
a translation lookaside buffer having a plurality of page table entries that is a part of a page table in a memory; and
an address translation circuit configured to translate the virtual address into the physical address based on a search result of the translation lookaside buffer,
wherein the plurality of the page table entries each includes translation information for translating the virtual address into the physical address and validity information, and
wherein the validity information is set based on a test result of the first self-test or the second self-test.

15. A semiconductor device comprising:
a first memory management unit receiving a memory access request with a virtual address, the first memory management unit having a first translation lookaside buffer storing a first part of a page table of a memory, the first memory management unit being configured to perform a first self-test on the first memory management unit itself; and
a second memory management unit having a second translation lookaside buffer that includes a second part of the page table of the memory and is accessed when the first lookaside buffer does not include a page table entry corresponding to the virtual address of the memory access request, the second memory management unit being configured to perform a second self-test on the second memory management unit itself, wherein the first memory management unit includes a test result storage storing a first test result of the first self-test and a second test result of the second self-test.

16. A semiconductor device comprising:

a central processing unit (CPU);

a first memory management unit receiving a memory access request with a virtual address and translating the virtual address of the memory access request into a physical address; and a second memory management unit coupled to the first memory management unit and translating the virtual address of the memory access request into the physical address when the first memory management unit does not translate the virtual address of the memory access request to the physical address, wherein the first memory management unit is configured to perform a first self-test to detect an address translation function error of the first memory management unit; and wherein the second memory management unit is configured to perform a second self-test to detect an address translation function error of the second memory management unit, and wherein the CPU instructs a reset operation for at least one of the first memory management unit and the second memory management unit based on error detection results of the first self-test and the second self-test.

* * * * *